(12) United States Patent
Duan (10) Patent No.: US 10,880,510 B2
(45) Date of Patent: Dec. 29, 2020

(54) CIRCUIT OF DETECTING LIGHT, IMAGE SENSOR AND ELECTRONIC DEVICE USING THE SAME AND METHOD OF DETECTING LIGHT BASED ON THE SAME

(71) Applicants: Beijing BOE Technology Development Co., Ltd., Beijing (CN); BOE TECHNOLOGY GROUP CO., LTD., Beijing (CN)

(72) Inventor: Liye Duan, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/679,834

(22) Filed: Nov. 11, 2019

(65) Prior Publication Data

US 2020/0221048 A1   Jul. 9, 2020

(30) Foreign Application Priority Data

Jan. 8, 2019   (CN) .......................... 2019 1 0015372

(51) Int. Cl.
*H04N 5/374* (2011.01)
*H04N 5/3745* (2011.01)
*H01L 27/146* (2006.01)

(52) U.S. Cl.
CPC ... *H04N 5/37457* (2013.01); *H01L 27/14609* (2013.01)

(58) Field of Classification Search
CPC ................. H04N 5/37457; H04N 5/369; H01L 27/14609; H01L 27/14643

(Continued)

(56) References Cited

U.S. PATENT DOCUMENTS

| 10,446,602 | B2* | 10/2019 | Wu ..................... H01L 27/1214 |
| 2007/0187609 | A1 | 8/2007 | Karim |
| 2018/0227529 | A1 | 8/2018 | Mo et al. |

FOREIGN PATENT DOCUMENTS

| CN | 102164252 A | 8/2011 |
| CN | 106657829 A | 5/2017 |
| CN | 108391070 A | 8/2018 |

OTHER PUBLICATIONS

First Office Action for CN Patent Application No. 201910015372.4 dated Aug. 28, 2020.

* cited by examiner

*Primary Examiner* — Yogesh K Aggarwal
(74) *Attorney, Agent, or Firm* — Thomas | Horstemeyer, LLP (57) ABSTRACT

The present disclosure provides a circuit for detecting light including a photoelectric conversion circuit, a reset circuit, a voltage amplifying circuit, and a current amplifying circuit, where the reset circuit writes a reset voltage provided by the reset power end to the first node in response to a reset control signal provided by the reset control signal line; the photoelectric conversion circuit collects incident light and generates a corresponding electrical signal according to the collected incident light; the voltage amplifying circuit performs voltage amplification processing on an electrical signal at the first node and writes the electrical signal after the voltage amplification processing to the second node, in response to an turn-on control signal provided by the turn-on control signal line; and the current amplifying circuit performs current amplification processing on the electrical signal at the second node and writes it to a signal reading line.

10 Claims, 9 Drawing Sheets

(58) Field of Classification Search
USPC ........ 348/294–324; 250/208.1; 257/290–292
See application file for complete search history.

CIRCUIT OF DETECTING LIGHT, IMAGE SENSOR AND ELECTRONIC DEVICE USING THE SAME AND METHOD OF DETECTING LIGHT BASED ON THE SAME

CROSS REFERENCE

This application is based upon, and claims the benefit of and priority to, Chinese Patent Application No. 201910015372.4, filed on Jan. 8, 2019, the entire contents thereof being incorporated herein by reference.

TECHNICAL FIELD

The present invention relates to the field of image sensing and, in particular, to a circuit of detecting light, an image sensor using the same, an electronic device using the same, and a method of detecting light based on the same.

BACKGROUND

Active pixel sensors (APS, also referred to as "circuit of detecting light") are used to convert light images into electrical signals, which are widely used in digital cameras, mobile phones having cameras, vision systems, and the like. The active pixel sensors can be divided into a charge-coupled device (CCD) type and a complementary metal oxide semiconductor (CMOS) type. Compared with the CCD type APS, the CMOS type APS has lower manufacturing cost, higher processing speed, and lower power consumption.

However, in practical applications, it is found that the CMOS type APS in existing image sensors has limited output swing magnitudes of final output electrical signals. Especially when the light dose is little, the voltage swing magnitude of output electrical signal of the CMOS type APS is very small, the current thereof is low, and it is difficult for the post stage processing circuit (image processor) to collect the effective output of the CMOS type APS, which leads to large errors in final light detecting results.

SUMMARY

The present disclosure aims to solve at least one of the technical problems existing in prior art, and provides a circuit of detecting light, an image sensor using the same, an electronic device using the same, and a method of detecting light based on the same.

In order to achieve the above objectives, an embodiment of the present disclosure provides a circuit of detecting light, including: a photoelectric conversion circuit, a reset circuit, a voltage amplifying circuit, and a current amplifying circuit, where an output end of the photoelectric conversion circuit, an output end of the reset circuit, and an input end of the voltage amplifying circuit are connected to a first node, and an output end of the voltage amplifying circuit and an input end of the current amplifying circuit are connected to a second node, the reset circuit is connected with a reset control signal line and a reset power end, and is configured to write a reset voltage provided by the reset power end to the first node in response to a control of a reset control signal provided by the reset control signal line, the photoelectric conversion circuit is configured to collect incident light and generate a corresponding electrical signal according to the collected incident light, to charge the first node, the voltage amplifying circuit is connected with a turn-on control signal line, and is configured to perform voltage amplification processing on an electrical signal at the first node, and write the electrical signal after the voltage amplification processing to the second node through the output end of the voltage amplifying circuit, in response to a control of an turn-on control signal provided by the turn-on control signal line, and the current amplifying circuit is connected with the turn-on control signal line, and is configured to perform current amplification processing on the electrical signal at the second node, and write the electrical signal after the current amplification processing to a signal reading line through an output end of the current amplifying circuit, in response to the control of the turn-on control signal.

In some embodiments, the voltage amplifying circuit includes a common source amplifying transistor and a first switching transistor, a gate electrode of the common source amplifying transistor is connected with the first node, a first electrode of the common source amplifying transistor is connected with the second node, and a second electrode of the common source amplifying transistor is connected with a first working power end, and a control electrode of the first switching transistor is connected with the turn-on control signal line, a first electrode of the first switching transistor is connected with a bias current source, and a second electrode of the first switching transistor is connected with the first electrode of the common source amplifying transistor.

In some embodiments, the current amplifying circuit includes a source following transistor and a second switching transistor, a gate electrode of the source following transistor is connected with the second node, a first electrode of the source following transistor is connected with a second working power end, and a second electrode of the source following transistor is connected with a first electrode of the second switching transistor, and a control electrode of the second switching transistor is connected with the turn-on control signal line, and a second electrode of the second switching transistor is connected with the signal reading line.

In some embodiments, the reset circuit includes a third switching transistor, and a control electrode of the third switching transistor is connected with the reset control signal line, a first electrode of the third switching transistor is connected with the reset power end, and a second electrode of the third switching transistor is connected with the first node.

In some embodiments, all of the transistors are N-type transistors, or all of the transistors are P-type transistors.

An embodiment of the present disclosure further provides an image sensor including the above circuit of detecting light.

In some embodiments, a number of the circuit of detecting light is plural, and all of the circuits of detecting light are arranged in an array in a row direction and a column direction, in the array, the circuits of detecting light located in the same row are connected to the same turn-on control signal line, and the circuits of detecting light located in different rows are connected to different turn-on control signal lines, the circuits of detecting light located in the same column are connected to the same signal reading line, and the circuits of detecting light located in different columns are connected to different signal reading lines, and all of the circuits of detecting light are connected to the same reset control signal line.

An embodiment of the present disclosure further provides an electronic device including above the image sensor.

An embodiment of the present disclosure further provides a method of detecting light, based on the above circuit of detecting light, and including:

providing, by the reset control signal line, a turn-on signal to the reset circuit, to write the reset voltage provided by the reset power end to the first node;

collecting the incident light and generating the corresponding electrical signal according to the collected incident light, by the photoelectric conversion circuit, to charge the first node; and providing, by the turn-on control signal line, a turn-on signal to the voltage amplifying circuit and the current amplifying circuit respectively, to output the electrical signal of the first node after the voltage amplification processing and the current amplification processing to the signal reading line.

An embodiment of the present disclosure further provides a method of detecting an image, based on the above image sensor, and including:

providing, by the reset control signal lines, a turn-on signal to the reset circuits in all of the circuits of detecting light in the image sensor, to simultaneously write the reset voltage provided by the reset power ends to the corresponding first nodes;

simultaneously collecting the incident light and generating corresponding electrical signals according to the collected incident light, by the photoelectric conversion circuits in all of the circuits of detecting light in the image sensor, to charge the corresponding first nodes; and providing, by the turn-on control signal lines, a turn-on signal to the voltage amplifying circuits and the current amplifying circuits in the corresponding circuits of detecting light in the image sensor, respectively, to output the electrical signals of the corresponding first nodes after the voltage amplification processing and the current amplification processing to the corresponding signal reading lines.

DETAILED DESCRIPTION

In order to make those skilled in the art better understand the technical solution of the present disclosure, a circuit of detecting light, an image sensor using the same, an electronic device using the same, a method of detecting light based on the same, and a method of detecting an image based on the same provided by the present disclosure are described in detail below with reference to the accompanying drawings.

Figure 1:
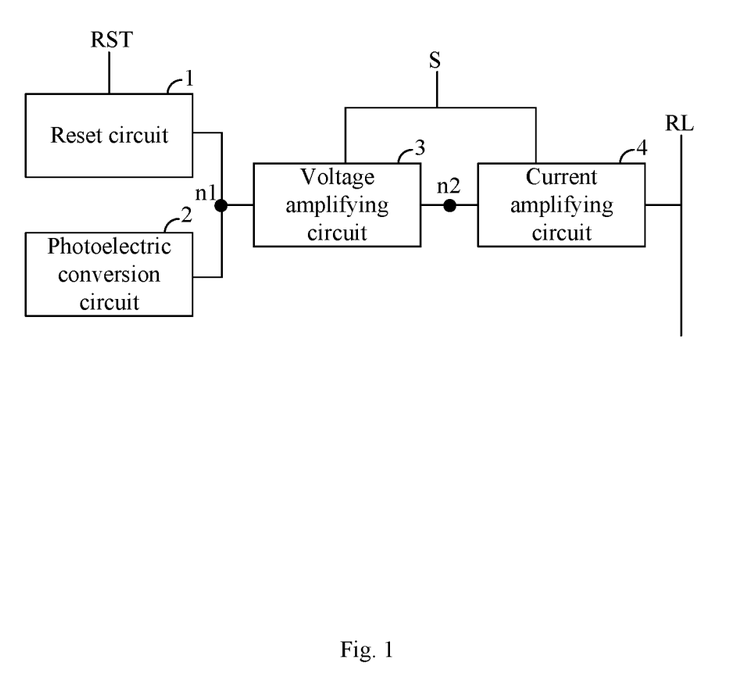
FIG. 1 is a circuit structure schematic diagram of a circuit of detecting light provided by the first embodiment of the present disclosure.

FIG. 1 is a circuit structure schematic diagram of a circuit of detecting light provided by the first embodiment of the present disclosure. As shown in FIG. 1, the circuit of detecting light includes a photoelectric conversion circuit 2, a reset circuit 1, a voltage amplifying circuit 3, and a current amplifying circuit 4. The photoelectric conversion circuit 2 has an output end. Each of the voltage amplifying circuit 3 and the current amplifying circuit 4 has an input end and an output end. The output end of the photoelectric conversion circuit 2, the output end of the reset circuit 1, and the input end of the voltage amplifying circuit 3 are connected to a first node n1. The output end of the voltage amplifying circuit 3 and the input end of the current amplifying circuit 4 are connected to a second node n2.

The reset circuit 1 is connected with a reset control signal line RST and a reset power end (see FIG. 2), and configured to write a reset voltage provided by the reset power end to the first node n1, in response to a control of a reset control signal provided by the reset control signal line RST. Here, for N-type transistor, the reset voltage is a high level voltage.

The photoelectric conversion circuit 2 is configured to collect incident light and generate a corresponding electrical signal according to the collected incident light to charge the first node n1. In various embodiments of the present disclosure, the description is made by taking a photoelectric conversion module including a photo diode as an example, wherein the anode of the photo diode PD can be connected with a power end (providing a voltage VR, see FIG. 2), and the cathode thereof is connected with the output end of the photoelectric conversion module. The photoelectric conversion module in the present disclosure may be other devices having a photoelectric conversion function as well.

The voltage amplifying circuit 3 is connected with a turn-on control signal line S, and configured to perform voltage amplification processing on the electrical signal at the first node n1, and write the electrical signal after the voltage amplification processing to the second node n2 through the output end thereof, in response to a control of a turn-on control signal provided by the turn-on control signal line S.

The current amplifying circuit 4 is connected with the turn-on control signal line S, and configured to perform current amplification processing on the electrical signal at the second node n2, and write the electrical signal after the current amplification processing to a signal reading line RL through the output end thereof for the post stage processing circuit (not shown) to determine light intensity of the incident light based on the electrical signal obtained through the signal reading line RL, in response to the control of the turn-on control signal.

In the light detecting process, the photoelectric conversion circuit 2 generates an electrical signal according to the collected light and charges the first node n1, and at this time, the voltage corresponding to the electrical signal at the first node n1 can represent light intensity of the incident light collected by the photoelectric conversion circuit 2. In the prior art, the electrical signal at the first node n1 is directly output as a final signal, and at this time, if the light dose collected by the photoelectric conversion circuit 2 is little, the voltage swing magnitude of the electrical signal at the first node n1 is small and the current thereof is low, and it is difficult for the post stage processing circuit (the post stage processing circuit collects the electrical signal at the first node n1 through the signal reading line RL) to perform efficient collection.

It should be noted that the post stage processing circuit can calculate to obtain the light intensity of the incident light received by the photoelectric conversion circuit 2 according to the voltage corresponding to the electrical signal output by the circuit of detecting light. The specific calculation process is a conventional technique in the art and will not be described in detail here.

In order to solve the above described technical problem, the technical solution of the present disclosure sets the voltage amplifying circuit 3 behind the first node n1 to perform voltage amplification processing on the electrical signal at the first node n1, and at the same time, further sets the current amplifying circuit 4 to perform current amplification processing on the electrical signal output by the voltage amplifying circuit 3 (which may be equivalent to voltage amplification and current amplification processing on the electrical signal at the first node n1), then the electrical signal output after the current amplification processing is written to the signal reading line RL, as an electrical signal finally output by the circuit of detecting light. The final output electrical signal has a large voltage swing magnitude and a large current, which facilitates efficient collection of the post stage processing circuit.

Figure 2:
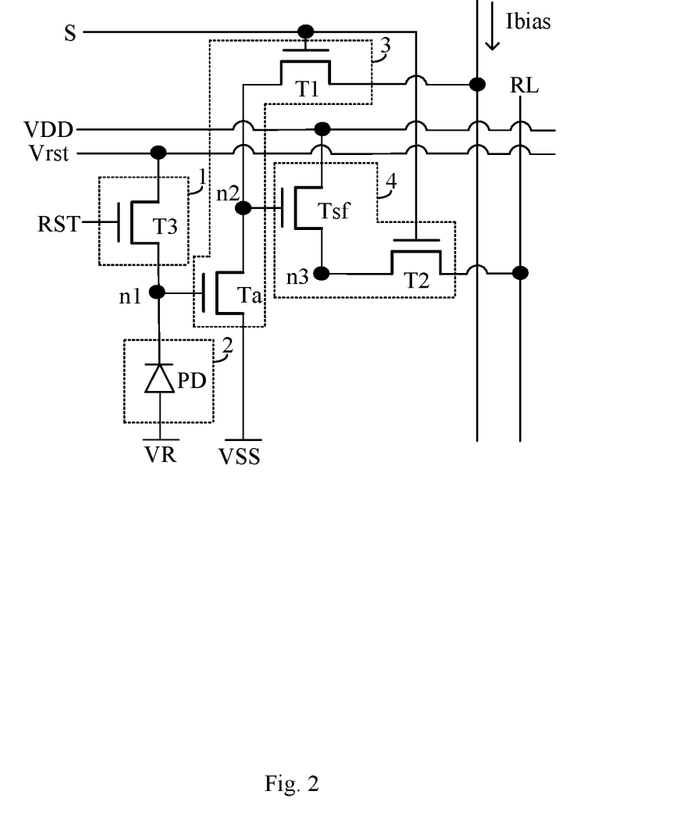
FIG. 2 is a circuit structure schematic diagram of a circuit of detecting light provided by the second embodiment of the present disclosure.

FIG. 2 is a circuit structure schematic diagram of a circuit of detecting light provided by the second embodiment of the present disclosure. As shown in FIG. 2, the circuit of detecting light is a specific embodiment based on the circuit of detecting light shown in FIG. 1.

Optionally, the voltage amplifying circuit 3 includes a common source amplifying transistor Ta and a first switching transistor T1.

The gate electrode of the common source amplifying transistor Ta is connected with the first node n1. The first electrode of the common source amplifying transistor Ta is connected with the second node n2. The second electrode of the common source amplifying transistor Ta is connected with a first working power end VSS. The control electrode of the first switching transistor T1 is connected with the turn-on control signal line S. The first electrode of the first switching transistor T1 is connected with a bias current source Ibias. The second electrode of the first switching transistor T1 is connected with the first electrode of the common source amplifying transistor Ta.

Optionally, the current amplifying circuit 4 includes a source following transistor Tsf and a second switching transistor T2.

The gate electrode of the source following transistor Tsf is connected with the second node n2. The first electrode of the source following transistor Tsf is connected with a second working power end VDD. The second electrode of the source following transistor Tsf is connected with the first electrode of the second switching transistor T2. The control electrode of the second switching transistor T2 is connected with the turn-on control signal line S. The second electrode of the second switching transistor T2 is connected with the signal reading line RL.

Optionally, the reset circuit 1 includes a third switching transistor T3. The control electrode of the third switching transistor T3 is connected with the reset control signal line RST. The first electrode of the third switching transistor T3 is connected with the reset power end Vrst. The second electrode of the third switching transistor T3 is connected with the first node n1.

In the present disclosure, a transistor generally includes three electrodes: a gate electrode, a source electrode, and a drain electrode. The source electrode and the drain electrode in the transistor are symmetrical in structure, and they are interchangeable as needed. In the present disclosure, the control electrode means the gate electrode of the transistor, one of the first electrode and the second electrode is the source electrode, and the other is the drain electrode.

In addition, according to characteristics of transistors, the transistors can be divided into N-type transistors and P-type transistors. When the transistor is an N-type transistor, its turn-on voltage is a high level voltage, and its turn-off voltage is a low level voltage. When the transistor is a P-type transistor, its turn-on voltage is a low level voltage, and its turn-off voltage is a high level voltage.

Hereinafter, the first switching transistor T1 to the third switching transistor T3, the common source amplifying transistor Ta and the source following transistor Tsf all being N-type transistors is taken as an example for exemplary description. At this time, the reset voltage provided by the reset power end is Vrst, the first working voltage provided by the first working power end is a low level voltage VSS, and the second working voltage provided by the second working power end is a high level voltage VDD.

The working process of the circuit of detecting light shown in FIG. 2 will be described in detail below with reference to the accompanying drawing.

Figure 3:
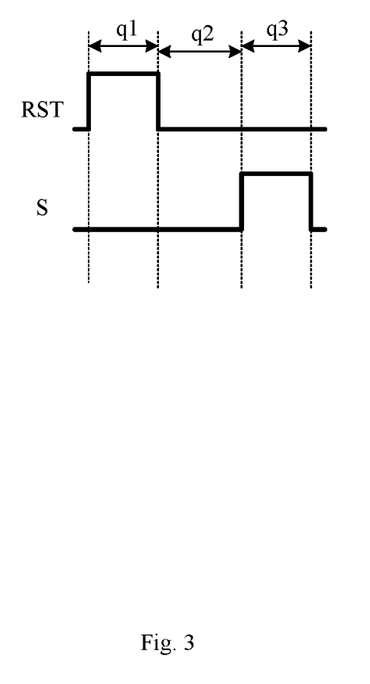
FIG. 3 is a working timing diagram of the circuit of detecting light shown in FIG. 2.

FIG. 3 is a working timing diagram of the circuit of detecting light shown in FIG. 2. As shown in FIG. 3, the working process of the circuit of detecting light includes three stages: a reset stage q1, an exposure sampling stage q2, and a reading stage q3.

In the reset stage q1, the reset control signal provided by the reset control signal line RST is at a high level state, and the turn-on control signal provided by the turn-on control signal line S is at a low level state. At this time, both the first switching transistor T1 and the second switching transistor T2 are turned off, and the third switching transistor T3 is turned on.

Since the third switching transistor T3 is turned on, the reset voltage Vrst is written to the first node n1 through the third switching transistor T3 to perform reset processing on the first node n1. At this time, the voltage at the first node n1 is Vrst. In the present disclosure, the DC working point of the common source electrode amplifying transistor Ta can be set by adjusting the reset voltage Vrst.

It should be noted that, when the voltage at the first node n1 is Vrst, the common source amplifying transistor Ta is in a turn-on transfer state, the voltage amplifying circuit 3 is in a DC working state, and the voltage at the second node n2 is approximately equal to VSS.

In the exposure sampling stage q2 (its duration time is t, and the value of t may be preset), the reset control signal provided by the reset control signal line RST is at a low level state, and the turn-on control signal provided by the turn-on control signal line S is at a low level state. At this time, all of the first switching transistor T1, the second switching transistor T2, and the third switching transistor T3 are turned off The photo diode PD collects incident light and generates charges to charge the first node n1. In the process, the voltage at the first node n1 is started to decrease. It may be assumed that the voltage change amount at the first node n1 (the difference between the voltage after the finish of charging and the voltage before charging) is ΔV at the end of the exposure sampling stage q2. In the embodiment, the voltage change amount ΔV at the first node n1 is less than or equal to 0. The voltage change amount ΔV at the first node n1 corresponds to light intensity of the incident light (in the case where the duration time t is constant, the stronger the incident light intensity is, the larger |ΔV| is).

At the end of the exposure sampling stage q2, the voltage at the first node n1 is Vrst+ΔV, and the voltage at the second node n2 is still approximately equal to VSS.

In the reading stage q3, the reset control signal provided by the reset control signal line RST is at a low level state, and the turn-on control signal provided by the turn-on control signal line S is at a high level state. At this time, both the first switching transistor T1 and the second switching transistor T2 are turned on, and the third switching transistor T3 is turned off.

Under the action of parasitic capacitance of the photo diode PD, the voltage at the first node n1 remains at Vrst+ΔV after the end of the exposure sampling. At this time, since the first transistor is turned on, a bias current provided by the bias current source is written to the second node n2 through the first transistor. At this time, the voltage amplifying circuit 3 is in a voltage amplifying state, and the voltage at the voltage of the second node n2 has started to rise from a level approximately equal to VSS and finally rises to an amplified voltage (which can be regarded as that the voltage amplifying circuit 3 outputs an amplified voltage). In the present embodiment, it is assumed that the amplified voltage at the second node n2 is Vn2, in the above described process, the voltage swing magnitude of the electrical signal at the second node n2 is approximately equal to Vn2−VSS.

The voltage gain of the voltage amplifying circuit 3 is related to the magnitude of the bias current provided by the bias current source. The larger the bias current is, the larger the voltage gain is. That is, in the case where the voltage at the first node n1 is constant, the larger the bias current is, the larger the amplified voltage Vn2 at the second node n2 is. Therefore, in actual applications, the voltage gain of the voltage amplifying circuit 3 can be controlled by controlling the magnitude of the bias current.

During the rising process of the voltage at the second node n2, the source following transistor Tsf is turned on and output a current, and the voltage at the third node n3 rises and follows the rising of the voltage at the second node n2. Specifically, the voltage at the third node n3 rises by Vn2−Vth from a level approximately equal to VSS, wherein Vth is the threshold voltage of the source following transistor Tsf (the threshold voltage of the N-type transistor is a positive value). That is, the voltage swing magnitude of the electrical signal at the third node n3 is approximately equal to Vn2−Vth−VSS. Moreover, since the second switching transistor T2 is turned on, the voltage swing magnitude of the electrical signal in the signal collecting line is approximately equal to Vn2−Vth−VSS as well. The post stage processing circuit can calculate the voltage change amount ΔV in the exposure sampling stage q2 according to the maximum voltage value Vn2−Vth of the electrical signal received through the signal collecting line, thereby being able to calculate the light intensity of the incident light.

Further, in the process in which the source following transistor Tsf is turned on and outputs a current to charge the third node n3, the source following transistor Tsf is in a saturated state, therefore, the source following transistor Tsf outputs a large current, and at this time, the current corresponding to the electrical signal in the signal collecting line is large.

It can be seen, the circuit of detecting light provided in the embodiment finally outputs an electrical signal with large voltage swing magnitude and a large current; therefore, it is convenient for the post stage processing circuit to perform efficient collection, thereby ensuring accuracy of the final light detecting result.

Figure 4:
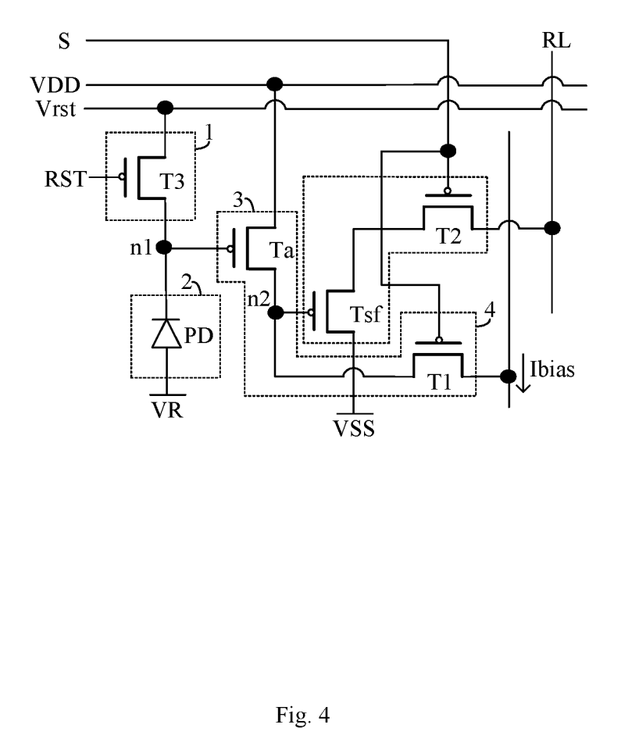
FIG. 4 is a circuit structure schematic diagram of another circuit of detecting light provided by the second embodiment of the present disclosure.
Figure 5:
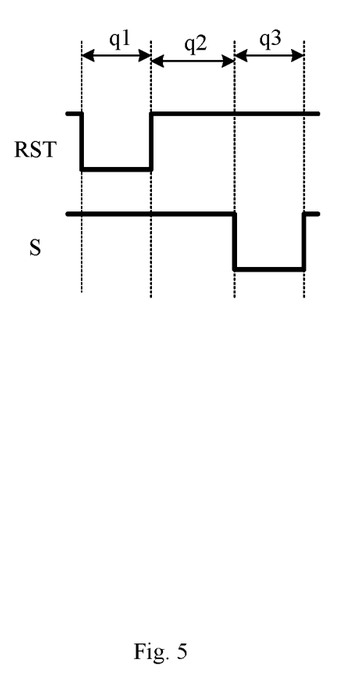
FIG. 5 is a working timing diagram of the circuit of detecting light shown in FIG. 4.

FIG. 4 is a circuit structure schematic diagram of another circuit of detecting light provided by the second embodiment of the present disclosure. FIG. 5 is a working timing diagram of the circuit of detecting light shown in FIG. 4. As shown in FIG. 4 and FIG. 5, what differs from the circuit of detecting light shown in FIG. 3 lies in that, in the circuit of detecting light of FIG. 4, all of the first switching transistor T1 to the third switching transistor T3, the common source amplifying transistor Ta and the source following transistor Tsf are P-type transistors.

At this time, the reset voltage provided by the reset power end is Vrst. The first working voltage provided by the first working power end is a high level voltage VDD. The second working voltage provided by the second working power end is a low level voltage VSS.

In the reset stage q1, the reset control signal provided by the reset control signal line RST is at a low level state, and the turn-on control signal provided by the turn-on control signal line S is at a high level state. At this time, both the first switching transistor T1 and the second switching transistor T2 are turned off, and the third switching transistor T3 is turned on.

In the exposure sampling stage q2, the reset control signal provided by the reset control signal line RST is at a high level state, and the turn-on control signal provided by the turn-on control signal line S is at a high level state. At this time, all of the first switching transistor T1, the second switching transistor T2, and the third switching transistor T3 are turned off.

In the reading stage q3, the reset control signal provided by the reset control signal line RST is at a high level state, and the turn-on control signal provided by the turn-on control signal line S is at a low level state. At this time, both the first switching transistor T1 and the second switching transistor T2 are turned on, and the third switching transistor T3 is turned off.

The foregoing corresponding content can be referred to for detailed description of the above described three stages, which will not be repeatedly described here.

It should be noted that, the cases where all of the transistors adopt P-type transistors at the same time or all of the transistors adopt N-type transistors at the same time in the embodiment, are the preferred embodiment of the present disclosure, which can make the transistors in the circuit of detecting light be simultaneously manufactured by adopting the same manufacturing process, thereby being able to reduce process steps. It should be understood by those skilled in the art that the technical solution of the present disclosure does not limit whether each transistor is an N-type transistor or a P-type transistor.

Figure 6:
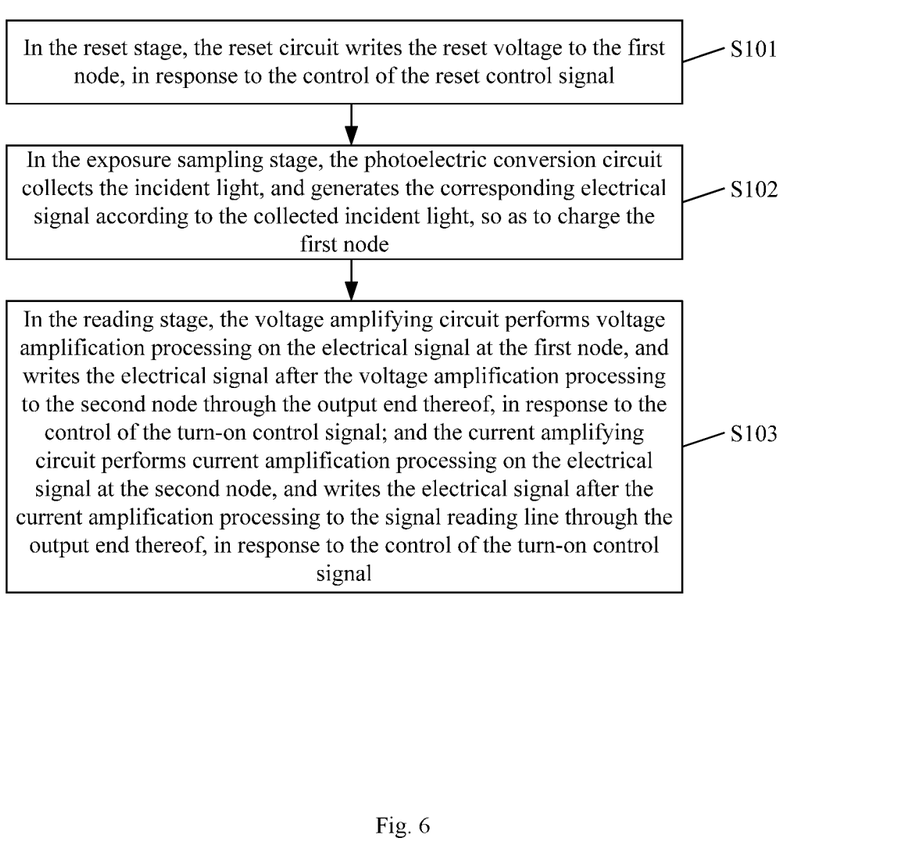
FIG. 6 is a flowchart of a method of detecting light provided by the third embodiment of the present disclosure.

FIG. 6 is a flowchart of a method of detecting light provided by the third embodiment of the present disclosure. As shown in FIG. 6, the method of detecting light is based on the circuit of detecting light provided in the above described first embodiment or the second embodiment. The method of detecting light includes:

Step S101: in the reset stage, the reset circuit writes the reset voltage to the first node, in response to the control of the reset control signal.

Step S102: in the exposure sampling stage, the photoelectric conversion circuit collects the incident light, and generates the corresponding electrical signal according to the collected incident light, so as to charge the first node.

Step S103: in the reading stage, the voltage amplifying circuit performs voltage amplification processing on the electrical signal at the first node, and writes the electrical signal after the voltage amplification processing to the second node through the output end thereof, in response to the control of the turn-on control signal; and the current amplifying circuit performs current amplification processing on the electrical signal at the second node, and writes the electrical signal after the current amplification processing to the signal reading line through the output end thereof, in response to the control of the turn-on control signal. Here, the reset control signal and the turn-on control signal can be generally referred to as a turn-on signal which makes the corresponding circuit work or turned-on, for example, the turn-on signal for a N-type transistor is a high level signal, and the turn-on signal for a N-type transistor is a low level signal.

The description in the above described first embodiment and second embodiment can be referred to for the specific description of the above described steps S101 to S103, which will not repeatedly described herein.

In the embodiment, the electrical signal finally output to the signal reading line by the step S103 has a large voltage swing magnitude and a large current, which facilitates efficient collection of the post stage processing circuit, thereby ensuring the accuracy of final light detecting result.

Figure 7:
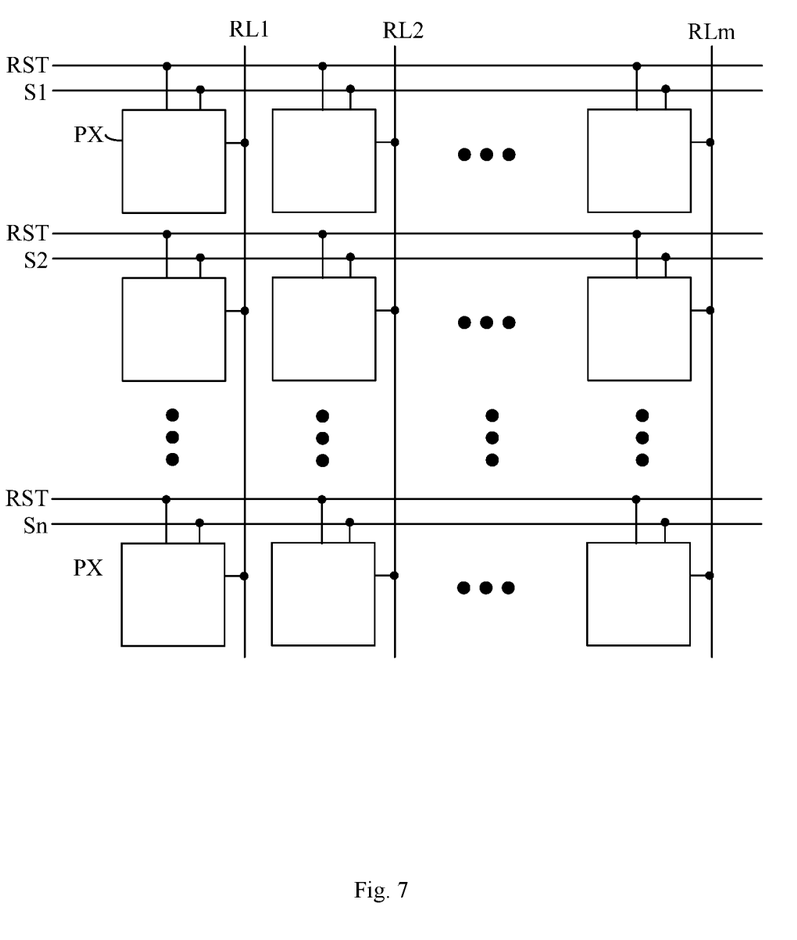
FIG. 7 is a circuit structure schematic diagram of an image sensor provided by the fourth embodiment of the present disclosure.

FIG. 7 is a circuit structure schematic diagram of an image sensor provided by the fourth embodiment of the present disclosure. As shown in FIG. 7, the image sensor includes circuits of detecting light PX. The circuit of detecting light PX adopts the circuit of detecting light provided in the above described first embodiment or second embodiment. The foregoing corresponding content can be referred to for detailed description of the circuit of detecting light PX, which will not be repeatedly described here.

Preferably, the number of the circuits of detecting light PX is plural, and all of the circuits of detecting light are arranged in an array in the row direction and the column direction (the array shown in the figure has n rows and m columns). In the array, the circuits of detecting light PX located in the same row are connected to the same turn-on control signal line S1, S2 . . . Sn, and the circuits of detecting light PX located in different rows are connected to different turn-on control signal lines S1, S2 . . . Sn. The circuits of detecting light PX located in the same column are connected to the same signal reading line RL1, RL2 . . . RLm, and the circuits of detecting light PX located in different columns are connected to different signal reading lines RL1, RL2 . . . RLm. All of the circuits of detecting light are connected to the same reset control signal line RST.

In the embodiment, the design that the circuits of detecting light PX located in the same row are connected to the same turn-on control signal line S1, S2 . . . Sn, the circuits of detecting light PX located in the same column are connected to the same signal reading line RL1, RL2 . . . RLm, and all of the circuits of detecting light PX are connected to the same reset control signal line, can effectively reduce the number of arranged signal wires in the image sensor, which is advantageous for improving recognition resolution of the image sensor.

Figure 8:
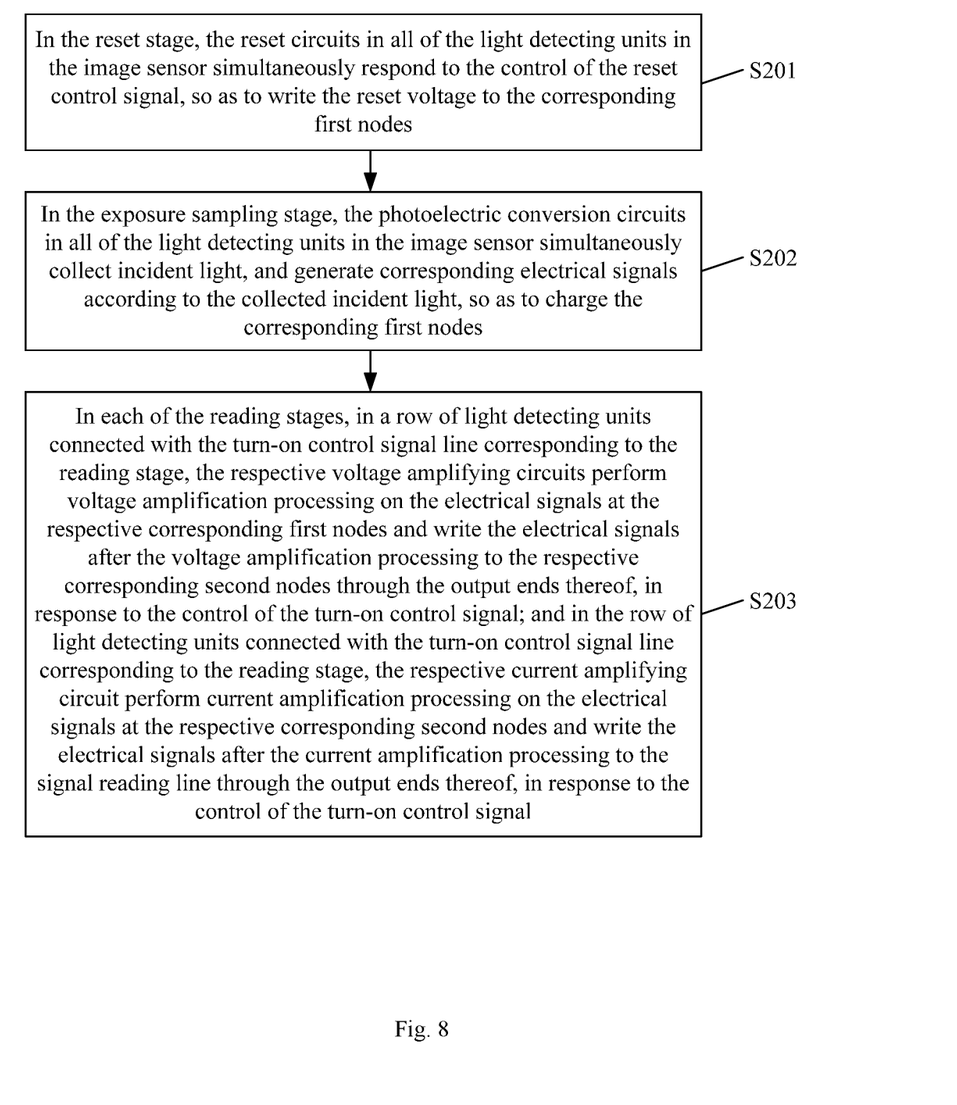
FIG. 8 is a flowchart of a method of detecting an image provided by the fifth embodiment of the present disclosure.

FIG. 8 is a flowchart of a method of detecting an image provided by the fifth embodiment of the present disclosure. As shown in FIG. 8, the method of detecting the image is based on the image sensor provided by the above described fourth embodiment, the number of circuits of detecting light in the image sensor is plural, and all of the circuits of detecting light are arranged in an array in the row direction and the column direction. The method of detecting an image includes:

Step S201: in the reset stage, the reset circuits in all of the circuits of detecting light in the image sensor simultaneously respond to the control of the reset control signal, so as to write the reset voltage to the corresponding first nodes.

Step S202: in the exposure sampling stage, the photoelectric conversion circuits in all of the circuits of detecting light in the image sensor simultaneously collect incident light, and generate corresponding electrical signals according to the collected incident light, so as to charge the corresponding first nodes.

Step S203: in the detecting stage including a plurality of reading stages that are in one-to-one correspondence with the turn-on control signal lines, in each of the reading stages, in a row of circuits of detecting light connected with the turn-on control signal line corresponding to the reading stage, the respective voltage amplifying circuits perform voltage amplification processing on the electrical signals at the respective corresponding first nodes and write the electrical signals after the voltage amplification processing to the respective corresponding second nodes through the output ends thereof, in response to the control of the turn-on control signal; and in the row of circuits of detecting light connected with the turn-on control signal line corresponding to the reading stage, the respective current amplifying circuit perform current amplification processing on the electrical signals at the respective corresponding second nodes and write the electrical signals after the current amplification processing to the signal reading line through the output ends thereof, in response to the control of the turn-on control signal.

Figure 9:
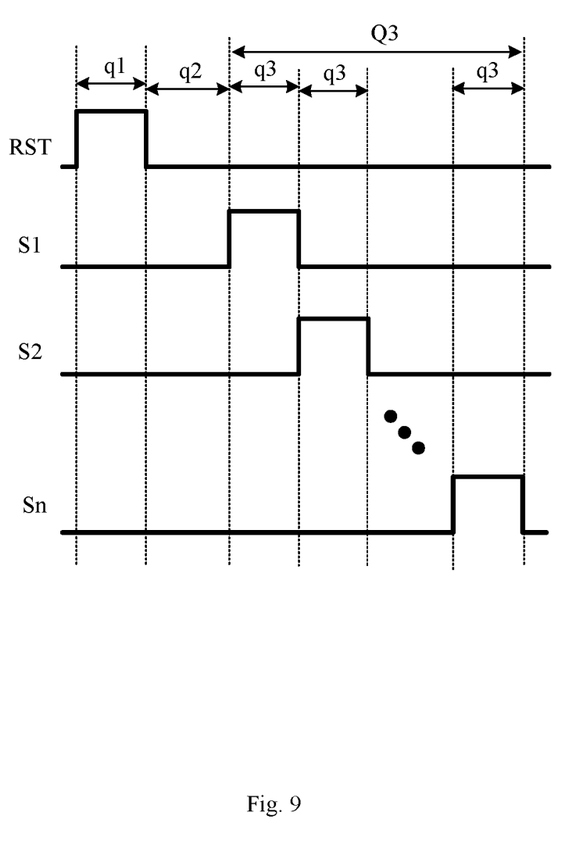
FIG. 9 is a working timing diagram of the image sensor shown in FIG. 7.

For convenience of description, FIG. 9 is a working timing diagram of the image sensor shown in FIG. 7. As shown in FIG. 9, it is assumed that the respective circuits of detecting light in the image sensor shown in FIG. 7 adopt the circuit of detecting light shown in FIG. 2, then the specific working process of the image sensor is as follows:

In step S101 (corresponding to the reset stage q1), the reset control signal provided by the reset control signal line RST is at a high level, and the turn-on control signals provided by the respective turn-on control signal lines S1 to Sn are at a low level. At this time, the voltages at the first nodes in the respective circuits of detecting light PX are Vrst (the respective first nodes complete resetting).

In step S102 (corresponding to the exposure detecting stage q2), the reset control signal provided by the reset control signal line RST is at a low level, and the turn-on control signals provided by the respective turn-on control signal lines S1 to Sn are at a low level. At this time, the photo diodes in the respective circuits of detecting light PX simultaneously perform exposure sampling, so as to charge the first nodes n1 to which the respective output ends thereof are connected (the respective circuit of detecting light simultaneously complete the exposure sampling).

In step S103 (corresponding to a detecting stage Q3), the reset control signal provided by the reset control signal line RST is at a low level, and the times when the turn-on control signals provided by the respective turn-on control signal lines S1 to Sn are at a high level state, are staggered in sequence. That is, the entire detecting stage Q3 is divided into n reading stages q3. One reading stage q3 corresponds to a turn-on control signal line S1, S2 . . . Sn. In one reading stage q3, the turn-on control signal in the corresponding turn-on control signal line is at a high level, while the turn-on control signals in other turn-on control signal lines are at a low level, so as to realize signal reading of a row of circuits of detecting light connected to the turn-on control signal line corresponding to the reading stage. The foregoing corresponding content can be referred to for detailed description of the signal reading process, which will not be repeatedly described here.

It should be understood by those skilled in the art that the working timing shown in FIG. 9 is only exemplary, and it does not limit the technical solution of the present disclosure.

The sixth embodiment of the present disclosure provides an electronic device including an image sensor, and the image sensor adopts the image sensor provided by the above described fourth embodiment. The electronic device can be a digital camera, a mobile phone, a tablet, a laptop, or the like.

It should be understood that the above embodiments are merely exemplary embodiments adopted to explain the principle of the disclosure, but the present disclosure is not limited thereto. Various modifications and improvements can be made by those skilled in the art without departing from the spirit and scope of the present disclosure. These modifications and improvements are also considered to be within the scope of the present disclosure.

What is claimed is:

1. A circuit for detecting light, comprising:
a photoelectric conversion circuit, a reset circuit, a voltage amplifying circuit, and a current amplifying circuit, wherein:
   an output end of the photoelectric conversion circuit, an output end of the reset circuit, and an input end of the voltage amplifying circuit are connected to a first node, and an output end of the voltage amplifying circuit and an input end of the current amplifying circuit are connected to a second node;
   the reset circuit is connected with a reset control signal line and a reset power end, and is configured to write a reset voltage provided by the reset power end to the first node in response to a control of a reset control signal provided by the reset control signal line;
   the photoelectric conversion circuit is configured to collect incident light and generate a corresponding electrical signal according to the collected incident light, to charge the first node;
   the voltage amplifying circuit is connected with a turn-on control signal line, and is configured to perform voltage amplification processing on an electrical signal at the first node and write the electrical signal after the voltage amplification processing to the second node through the output end of the voltage amplifying circuit, in response to a control of a turn-on control signal provided by the turn-on control signal line; and
   the current amplifying circuit is connected with the turn-on control signal line, and is configured to perform current amplification processing on the electrical signal at the second node and write the electrical signal after the current amplification processing to a signal reading line through an output end of the current amplifying circuit, in response to the control of the turn-on control signal.

2. The circuit for detecting light according to claim 1, wherein:
   the voltage amplifying circuit comprises a common source amplifying transistor and a first switching transistor,
   a gate electrode of the common source amplifying transistor is connected with the first node, a first electrode of the common source amplifying transistor is connected with the second node, and a second electrode of the common source amplifying transistor is connected with a first working power end; and
   a control electrode of the first switching transistor is connected with the turn-on control signal line, a first electrode of the first switching transistor is connected with a bias current source, and a second electrode of the first switching transistor is connected with the first electrode of the common source amplifying transistor.

3. The circuit for detecting light according to claim 1, wherein:
   the current amplifying circuit comprises a source following transistor and a second switching transistor;
   a gate electrode of the source following transistor is connected with the second node, a first electrode of the source following transistor is connected with a second working power end, and a second electrode of the source following transistor is connected with a first electrode of the second switching transistor; and
   a control electrode of the second switching transistor is connected with the turn-on control signal line, and a second electrode of the second switching transistor is connected with the signal reading line.

4. The circuit for detecting light according to claim 1, wherein:
   the reset circuit comprises a third switching transistor; and
   a control electrode of the third switching transistor is connected with the reset control signal line, a first electrode of the third switching transistor is connected with the reset power end, and a second electrode of the third switching transistor is connected with the first node.

5. The circuit for detecting light according to claim 2, wherein each of the transistors are N-type transistors, or each of the transistors are P-type transistors.

6. An image sensor, comprising the circuit for detecting light according to claim 1.

7. The image sensor according to claim 6, wherein:
   the circuit for detecting light is one of a plurality of circuits for detecting light, and each of the circuits for detecting light are arranged in an array in a row direction and a column direction;
   in the array, the circuits for detecting light located in the same row are connected to the same turn-on control signal line, and the circuits for detecting light located in different rows are connected to different turn-on control signal lines;
   the circuits for detecting light located in the same column are connected to the same signal reading line, and the circuits for detecting light located in different columns are connected to different signal reading lines; and
   each of the circuits for detecting light are connected to the same reset control signal line.

8. An electronic device, comprising the image sensor according to claim 7.

9. A method for detecting light based on the circuit for detecting light according to claim 1, comprising:

providing, by the reset control signal line, a turn-on signal to the reset circuit, to write the reset voltage provided by the reset power end to the first node;

collecting the incident light and generating the corresponding electrical signal according to the collected incident light, by the photoelectric conversion circuit, to charge the first node; and providing, by the turn-on control signal line, a turn-on signal to the voltage amplifying circuit and the current amplifying circuit respectively, to output the electrical signal of the first node after the voltage amplification processing and the current amplification processing to the signal reading line.

10. A method for detecting an image based on the image sensor according to claim 7, comprising:

providing, by the reset control signal lines, a turn-on signal to the reset circuits in all of the circuits of detecting light in the image sensor, to simultaneously write the reset voltage provided by the reset power ends to the corresponding first nodes;

simultaneously collecting the incident light and generating corresponding electrical signals according to the collected incident light, by the photoelectric conversion circuits in all of the circuits of detecting light in the image sensor, to charge the corresponding first nodes; and providing, by the turn-on control signal lines, a turn-on signal to the voltage amplifying circuits and the current amplifying circuits in the corresponding circuits of detecting light in the image sensor, respectively, to output the electrical signals of the corresponding first nodes after the voltage amplification processing and the current amplification processing to the corresponding signal reading lines.

* * * * *